(12) United States Patent
Lee et al.

(10) Patent No.: US 9,159,568 B2
(45) Date of Patent: Oct. 13, 2015

(54) METHOD FOR FABRICATING MEMORY CELLS HAVING SPLIT CHARGE STORAGE NODES

(75) Inventors: Chungho Lee, Sunnyvale, CA (US); Wei Zheng, Santa Clara, CA (US); Chi Chang, Saratoga, CA (US); Unsoon Kim, San Jose, CA (US); Hiroyuki Kinoshita, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 356 days.

(21) Appl. No.: 11/639,666

(22) Filed: Dec. 15, 2006

(65) Prior Publication Data
US 2008/0142875 A1    Jun. 19, 2008

Related U.S. Application Data

(60) Provisional application No. 60/764,847, filed on Feb. 4, 2006.

(51) Int. Cl.
  *H01L 21/28*    (2006.01)
  *H01L 29/66*    (2006.01)
  (Continued)

(52) U.S. Cl.
  CPC ........ *H01L 21/28282* (2013.01); *H01L 27/115* (2013.01); *H01L 27/11521* (2013.01); *H01L 27/11568* (2013.01); *H01L 29/1037* (2013.01); *H01L 29/1083* (2013.01);
  (Continued)

(58) Field of Classification Search
  CPC ............ H01L 27/115; H01L 27/11563; H01L 27/11568; H01L 21/28282; H01L 29/1083; H01L 29/66537

USPC ......... 438/211, 212, 216, 301, 201, 407, 520, 438/528, 264, 279, 287, 289, 290, 291, 526, 438/259, 267; 365/185.28; 257/314, 400, 257/E21.68, E21.681, E21.682, E21.537, 257/E21.545, E21.556, E21.558, E21.618, 257/E21.637, 652, E29.016, E21.179
See application file for complete search history.

(56) References Cited

U.S. PATENT DOCUMENTS

| | | | | |
|---|---|---|---|---|
| 5,204,835 A | * | 4/1993 | Eitan | 365/185.16 |
| 5,382,534 A | * | 1/1995 | Sheu et al. | 438/302 |

(Continued)

FOREIGN PATENT DOCUMENTS

| | | | | |
|---|---|---|---|---|
| EP | 1 205 978 | | 5/2002 | |
| EP | 1 300 888 | | 4/2003 | |
| JP | 03046275 A | * | 2/1991 | ............ H01L 29/784 |

*Primary Examiner* — Joseph C Nicely

(57) ABSTRACT

Memory cells having split charge storage nodes and methods for fabricating memory cells having split charge storage nodes are disclosed. A disclosed method includes forming a first trench and an adjacent second trench in a semiconductor substrate, the first trench and the second trench each defining a first sidewall and a second sidewall respectively and forming a first source/drain region in the substrate and a second source/drain region in the substrate, where the first source/drain region and the second source/drain region are formed substantially under the first trench and the second trench in the semiconductor substrate respectively. Moreover, a method includes forming a bit line punch through barrier in the substrate between the first source/drain region and the second source drain region and forming a first storage element on the first sidewall of the first trench and a second storage element on the second sidewall of the second element. A word line is formed in contact with the first storage element and the second storage element.

7 Claims, 13 Drawing Sheets

(51) Int. Cl.
*H01L 29/10* (2006.01)
*H01L 27/115* (2006.01)
*H01L 29/423* (2006.01)
*H01L 29/788* (2006.01)
*H01L 29/792* (2006.01)

(52) U.S. Cl.
CPC ... *H01L 29/42332* (2013.01); *H01L 29/42348* (2013.01); *H01L 29/66537* (2013.01); *H01L 29/7887* (2013.01); *H01L 29/7923* (2013.01)

(56) References Cited

U.S. PATENT DOCUMENTS

| | | | |
|---|---|---|---|
| 5,429,956 A * | 7/1995 | Shell et al. | 438/291 |
| 5,677,218 A * | 10/1997 | Tseng | 438/291 |
| 5,712,501 A * | 1/1998 | Davies et al. | 257/335 |
| 5,856,225 A * | 1/1999 | Lee et al. | 438/291 |
| 5,893,740 A * | 4/1999 | Chang et al. | 438/289 |
| 5,930,642 A * | 7/1999 | Moore et al. | 438/407 |
| 5,955,767 A | 9/1999 | Liu et al. | 257/369 |
| 5,969,383 A * | 10/1999 | Chang et al. | 257/316 |
| 5,977,602 A * | 11/1999 | Gardner et al. | 257/438 |
| 6,025,238 A * | 2/2000 | Gardner | 438/261 |
| 6,108,242 A * | 8/2000 | Lin et al. | 365/185.33 |
| 6,117,739 A * | 9/2000 | Gardner et al. | 438/289 |
| 6,124,177 A * | 9/2000 | Lin et al. | 438/305 |
| 6,172,402 B1 * | 1/2001 | Gardner et al. | 257/347 |
| 6,215,702 B1 | 4/2001 | Derhacobian et al. | 365/185.29 |
| 6,221,724 B1 * | 4/2001 | Yu et al. | 438/289 |
| 6,232,160 B1 * | 5/2001 | Shih et al. | 438/197 |
| 6,232,164 B1 * | 5/2001 | Tsai et al. | 438/217 |
| 6,245,618 B1 * | 6/2001 | An et al. | 438/289 |
| 6,255,689 B1 * | 7/2001 | Lee | 257/314 |
| 6,319,807 B1 * | 11/2001 | Yeh et al. | 438/595 |
| 6,429,099 B1 * | 8/2002 | Christensen et al. | 438/480 |
| 6,440,805 B1 * | 8/2002 | Wang et al. | 438/282 |
| 6,458,664 B2 * | 10/2002 | Richter et al. | 438/291 |
| 6,479,356 B1 * | 11/2002 | Matsuoka | 438/289 |
| 6,596,593 B2 * | 7/2003 | Ishii | 438/275 |
| 6,639,271 B1 | 10/2003 | Zheng et al. | 257/324 |
| 6,770,934 B1 | 8/2004 | Hung et al. | 257/331 |
| 6,861,307 B2 * | 3/2005 | Zheng et al. | 438/216 |
| 6,917,068 B1 | 7/2005 | Krivokapic | 257/314 |
| 6,998,318 B2 * | 2/2006 | Park | 438/289 |
| 7,071,060 B1 * | 7/2006 | Guterman et al. | 438/263 |
| 7,129,138 B1 * | 10/2006 | Furukawa et al. | 438/294 |
| 7,250,340 B2 * | 7/2007 | Swift et al. | 438/259 |
| 7,262,997 B2 * | 8/2007 | Yater et al. | 365/185.18 |
| 7,375,375 B2 * | 5/2008 | Yamazaki et al. | 257/59 |
| 7,442,980 B2 * | 10/2008 | Lai et al. | 257/302 |
| 7,560,779 B2 * | 7/2009 | Rodder et al. | 257/369 |
| 7,687,855 B2 * | 3/2010 | Miyanaga et al. | 257/344 |
| 2003/0006428 A1 * | 1/2003 | Palm et al. | 257/200 |
| 2003/0080356 A1 * | 5/2003 | Miida | 257/200 |
| 2003/0186511 A1 * | 10/2003 | Yiu et al. | 438/400 |
| 2004/0005761 A1 | 1/2004 | Shibata | 438/261 |
| 2004/0005766 A1 * | 1/2004 | Lai et al. | 438/424 |
| 2004/0021172 A1 * | 2/2004 | Zheng et al. | 257/316 |
| 2004/0065926 A1 * | 4/2004 | Watanabe et al. | 257/361 |
| 2004/0222457 A1 * | 11/2004 | Kim et al. | 257/328 |
| 2004/0232498 A1 * | 11/2004 | Kitamura | 257/391 |
| 2004/0238852 A1 * | 12/2004 | Lee et al. | 257/204 |
| 2005/0064651 A1 * | 3/2005 | Kim | 438/231 |
| 2005/0191812 A1 * | 9/2005 | Pritchard et al. | 438/299 |
| 2005/0259475 A1 * | 11/2005 | Forbes | 365/185.28 |
| 2006/0033180 A1 * | 2/2006 | Herner | 257/530 |
| 2006/0043457 A1 * | 3/2006 | Baik | 257/314 |
| 2006/0084219 A1 * | 4/2006 | Lusky et al. | 438/201 |
| 2006/0091424 A1 * | 5/2006 | Strassburg et al. | 257/208 |
| 2006/0110900 A1 * | 5/2006 | Youn et al. | 438/592 |
| 2006/0115955 A1 * | 6/2006 | Huang et al. | 438/400 |
| 2006/0211204 A1 * | 9/2006 | Huang et al. | 438/259 |
| 2006/0267090 A1 * | 11/2006 | Sapp et al. | 257/341 |
| 2006/0286741 A1 * | 12/2006 | Pan et al. | 438/238 |
| 2006/0291281 A1 * | 12/2006 | Wang et al. | 365/185.05 |
| 2007/0001257 A1 * | 1/2007 | Lai et al. | 257/499 |
| 2007/0018207 A1 * | 1/2007 | Prinz | 257/288 |
| 2007/0051982 A1 * | 3/2007 | Bloom et al. | 257/202 |
| 2008/0001219 A1 * | 1/2008 | Bhalla et al. | 257/330 |
| 2008/0061340 A1 * | 3/2008 | Heineck et al. | 257/301 |
| 2008/0067572 A1 * | 3/2008 | Mokhlesi | 257/315 |
| 2008/0085579 A1 * | 4/2008 | Wu et al. | 438/208 |
| 2008/0150001 A1 * | 6/2008 | Zheng et al. | 257/324 |
| 2008/0220576 A1 * | 9/2008 | Lai et al. | 438/257 |
| 2008/0233687 A1 * | 9/2008 | Chen et al. | 438/151 |
| 2009/0027942 A1 * | 1/2009 | Chen et al. | 365/104 |
| 2009/0057727 A1 * | 3/2009 | Kapoor | 257/256 |
| 2009/0224316 A1 * | 9/2009 | Bhalla et al. | 257/332 |
| 2011/0183501 A1 * | 7/2011 | Hirakata et al. | 438/478 |
| 2011/0203659 A1 * | 8/2011 | Carroll et al. | 136/256 |
| 2012/0044735 A1 * | 2/2012 | Tran et al. | 365/63 |
| 2014/0264573 A1 * | 9/2014 | Kocon et al. | 257/331 |

* cited by examiner

METHOD FOR FABRICATING MEMORY CELLS HAVING SPLIT CHARGE STORAGE NODES

RELATED APPLICATIONS

This Application claims the benefit of U.S. Provisional Application No. 60/764,847 filed on Feb. 4, 2006.

FIELD OF THE INVENTION

The present invention relates to memory cells that have split charge storage nodes.

BACKGROUND

Many consumer electronic products help to satisfy consumer need of basic communications and entertainment services. Such consumer electronic products include televisions, digital cameras, cellular telephones, media content players, etc. Components that play important roles in the operation of these technologies include processors and data storage devices. Data storage devices include RAM, ROM, flash memory products, etc.

An important parameter of data storage devices is memory cell density. It should be appreciated that memory cell density of data storage devices such as memory arrays is important because data storage capacity per unit area of the memory array is directly related thereto. There are many approaches to increasing the memory cell density of memory arrays. One approach involves reducing the channel length between the source and the drain of respective transistors associated with respective memory cells in a memory array. This allows the size of each memory cell to be reduced which in turn facilitates the provision of denser memory arrays. Another approach to increasing memory cell density is embodied in a commercially available flash memory product called MirrorBit™ Technology from Spansion, located in Sunnyvale, Calif.

In flash memory arrays that use MirrorBit technology, a MirrorBit cell is employed that effectively doubles the intrinsic density of the flash memory array by storing two physically distinct bits on opposite sides of a memory cell. Each bit that is stored within a cell serves as a binary unit of data (either a logic one or zero) that is mapped directly to the memory array. The MirrorBit cell includes two source/drain regions formed in a silicon substrate. A storage element, that includes a first planer oxide layer, a nitride layer, and a second oxide layer, is formed on the silicon substrate. A polysilicon gate is then formed over the storage element. For more details on MirrorBit technology, see U.S. Pat. Nos. 6,861,307, 6,917,068, 6,639,271, 6,215,702 and 2004/0021172, each of which are incorporated herein by reference.

An exemplary MirrorBit™ memory device includes a semiconductor substrate with spaced apart source and a drain regions (both typically having N-type conductivity) formed in the bulk of the substrate. An oxide-nitride-oxide (ONO) layered stack is formed on the top surface of the substrate between the source and drain regions. A gate electrode, which typically comprises an N or N+ polysilicon layer, is formed over the ONO stack. The ONO stack includes a first or bottom dielectric layer (often referred to as a bottom tunnel oxide), a charge storing nitride layer, and a second or top dielectric layer of oxide.

Programming of such a MirrorBit™ cell can be accomplished, for example, by hot electron injection. Hot electron injection involves applying appropriate voltage potentials to each of the gate, the source, and the drain of the cell for a specified duration until the charge storing layer accumulates charge. Such a process is disclosed in U.S. Pat. No. 6,215,702, which is incorporated herein by reference in its entirety.

Erasure of a MirrorBit™ cell can be accomplished using, for example, the conventional technique of "hot hole injection" (sometimes referred to as band-to-band (BTB) hot hole injection). In hot hole injection a gate voltage of 4.0 to 8.0 volts is applied along with a drain voltage on the order of 4.0-6.0 volts, while the source is floated or grounded to erase one of the memory cells (typically the normal bit). Conversely, the complementary bit cell is erased by floating the drain and applying the appropriate voltage to the source and the gate. With such erase conditions, a BTB tunnel current is created under the gate. Holes are generated under these conditions and accelerate from the N-type drain region into the P-type substrate. The generated holes are accelerated in the electrical field created near the P-N drain/body junction. Some of the accelerated holes surmount the oxide to silicon interface between the substrate and the bottom oxide and are injected into the nitride layer to displace electrons (e.g., by recombination) and erase the cell.

Another erase mechanism is channel erase, also commonly referred to as a Fowler-Nordheim (FN) erase operation. Typically, in conventional MirrorBit™—type memory cells, the top and bottom oxides have the same dielectric constant, resulting in the vertical fields during the erase being the same across both the top and bottom oxides. Therefore, during an FN channel erase, electrons are pushed out from the charge storing layer to the substrate. At the same time, more electrons flow from the N gate through the top oxide and get trapped in the charge storing layer. Therefore, while there is a net current from the control gate to the substrate, charge is not erased effectively from the charge storing layer.

Problems with the above discussed memory types can include but are not limited to bit line punch through, channel hot electron injection (CHEI), complimentary bit disturb and transient bit disturb. These issues which can be aggravated by attempts to scale devices to smaller dimensions hamper efforts to further increase the density of flash memory devices.

Punch through occurs when diffusion associated with the source and drain regions of a transistor overlap. When this occurs a transistor can remain on even when a voltage intended to turn it off is applied to its gate. Punch through can be a potential problem in transistors such as those discussed above because the source and drain regions of such transistors are typically fabricated relatively closely together. As the pitch of memory cells becomes smaller and smaller with advances in semiconductor fabrication technology, punch through is likely to become an even more significant issue.

Channel hot electron injection (CHEI) occurs when charge that is associated with bits that are stored on opposite sides of a memory cell overlap. When this occurs dual bit ambiguity can be caused from channel hot electron injection (CHEI) program distribution and lateral charge diffusion as gate length is scaled down. The inability to distinguish bits during such a condition can result in erroneous readings.

Complimentary bit disturb occurs when the programming of one bit in a mirror bit memory cell causes electrons or holes to be injected into the charge storage space of a complimentary bit. When this occurs the programmed state of the complimentary bit can be affected which can cause erroneous readings of the bit. Complimentary bit disturb can be a problem in transistors such as those discussed above because the charge storage space of the bits in such transistors are closely located.

Transient bit disturb occurs when the programming of one bit in a mirror bit memory cell causes electrons or holes to be injected into the charge storage space of an adjacent cell. When this occurs the programmed state of the adjacent cell can be affected which can cause erroneous readings. Transient bit disturb can be a potential problem in mirror bit memory arrays such as those discussed above because the memory cells in such memory arrays are typically fabricated relatively closely together.

Additional issues associated with the above discussed Mirror Bit™ device are related to structural and functional features of the device. For example, it can be difficult to reduce the size or pitch of the cell because the storage element of the above-mentioned flash memory cell is planar (the oxide, nitride and oxide layers are all horizontal layers formed one on top of the other on the silicon substrate). Moreover, as it regards the above discussed erasure of a Mirror Bit™ cell by hot hole injection, because these hot holes bombard the interface between the substrate and the bottom tunnel oxide, the interface as well as the bottom tunnel oxide can be damaged causing undesirable interface states and degraded reliability over program/erase cycling.

As can be seen from the above discussion, conventional approaches to increasing memory cell density are inadequate. These approaches can precipitate undesirable consequences that negatively affect device function.

SUMMARY OF THE INVENTION

Memory cells having split charge storage nodes and methods for fabricating memory cells having split charge storage nodes are disclosed. A disclosed method includes forming a first trench and an adjacent second trench in a semiconductor substrate, the first trench and the second trench each defining a first sidewall and a second sidewall respectively and forming a first source/drain region in the substrate and a second source/drain region in the substrate, where the first source/drain region and the second source/drain region are formed substantially under the first trench and the second trench in the semiconductor substrate respectively. Moreover, a method includes forming a bit line punch through barrier in the substrate between the first source/drain region and the second source drain region and forming a first storage element on the first sidewall of the first trench and a second storage element on the second sidewall of the second element. A word line is formed in contact with the first storage element and the second storage element.

BRIEF DESCRIPTION OF THE DRAWINGS

The invention, together with further advantages thereof, may best be understood by reference to the following description taken in conjunction with the accompanying drawings in which.

It should be noted that like reference numbers refer to like elements in the figures.

DETAILED DESCRIPTION OF THE INVENTION

The present invention will now be described in detail with reference to a various embodiments thereof as illustrated in the accompanying drawings. In the following description, specific details are set forth in order to provide a thorough understanding of the present invention. It will be apparent, however, to one skilled in the art, that the present invention may be practiced without using some of the implementation details set forth herein. It should also be understood that well known operations have not been described in detail in order to not unnecessarily obscure the present invention.

Figure 1:
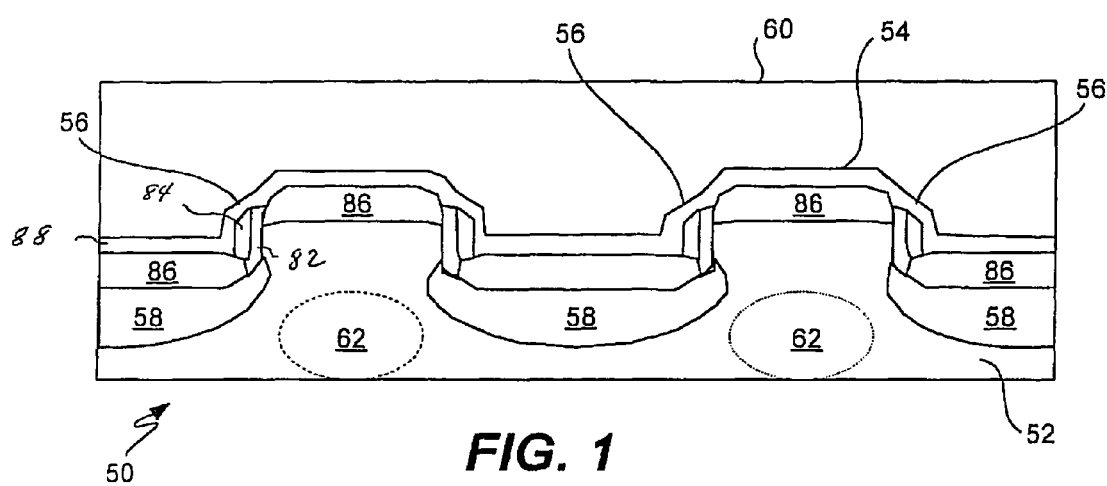
FIG. 1 is a cross section of the flash memory cell according to the one embodiment of the present invention.

Memory Cell Having Split Charge Storage Node According to One Embodiment of the Present Invention FIG. 1 shows a cross section of a memory cell that has a split charge storage node according to one embodiment of the invention. In this embodiment, memory 50 includes silicon substrate 52, memory cell 54, having two vertically orientated storage elements 56, consisting of first oxide layer 82, charge storage layer 84, and second oxide layer 88, formed within the sidewalls of trenches formed in the substrate 52, two source/drain regions 58 formed in the substrate 52, a word line 60, and bit line punch through barrier region 62, provided in the substrate 52 between the two source/drain regions 58. The purpose of barrier regions 62 is to prevent punch through of charged carriers between the two source/drain regions 58 of cell 54. In various embodiments, substrate 52 can be either a P or N type doped substrate.

In one embodiment, the split charge storage node represented by the two vertically oriented storage elements 56, solves the problem of dual bit ambiguity which can be caused by channel hot electron injection (CHEI) program distribution and lateral charge diffusion as the gate length is scaled down into the sub-65 nm regime. Additionally, the split charge storage node reduces complimentary bit disturb (CBD). Moreover, barrier region 62 (e.g., an oxide trench box) blocks bit line punch through. Also, barrier region 62 blocks transient pulse disturb (TPD). By forming the storage elements in a vertical plane within the trenches, the size or pitch of the cell can be reduced.

It should be appreciated that the gate structure which partially surrounds or "wraps" the channel provides greater gate control of the channel. In one embodiment, this can be due to the convergent fields that the aforementioned gate structure provides. Moreover, further scaling (e.g., below 45 nm) can be facilitated because of the longer channel length (that reduces short channel effect) that is formed as a consequence of the charge storage node structure.

Process Flow for Forming Memory Cell Having Split Charge Storage Node

FIGS. 2A-2M show a series of cross sections illustrating the process flow involved in forming a memory cell having a split charge storage node according to one embodiment of the invention is shown.

Figure 2A:
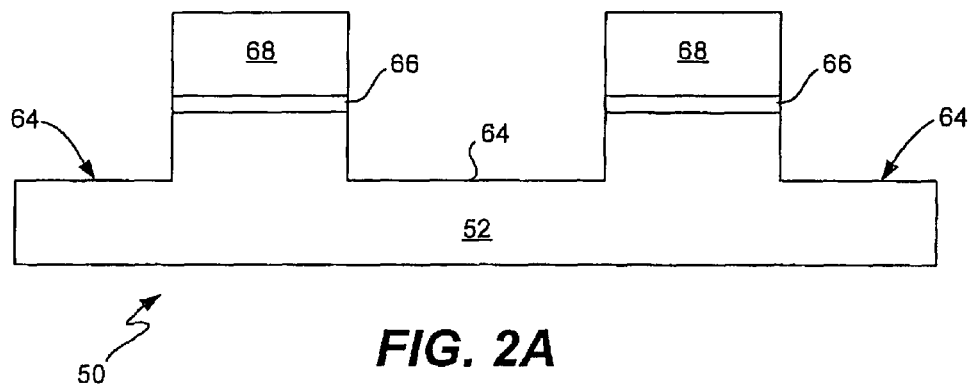
FIG. 2A shows a resultant cross sectional view subsequent to one or more operations in a process for forming a memory cell according to one embodiment of the present invention.

As shown in FIG. 2A, in an initial operation trenches 64 are formed in substrate 52. The trenches 64 are formed by first forming pad oxide layer 66 and subsequently patterned hard mask 68 on the surface of substrate 52 using conventional semiconductor processing techniques. Once the hard mask 68 has been patterned, substrate 52 is subjected to a silicon etch, creating trenches 64 in the exposed, unmasked, areas.

In various embodiments, the silicon etch can be either a wet etch or a dry etch. In one embodiment, the depth of the trenches can be 100-1000 Angstroms. In other embodiments, other trench depths can be employed. In one embodiment, the actual trench depths can be shallower or deeper than the aforementioned depths, depending on a desired pitch of memory cell 54 and other process variables.

Figure 2B:
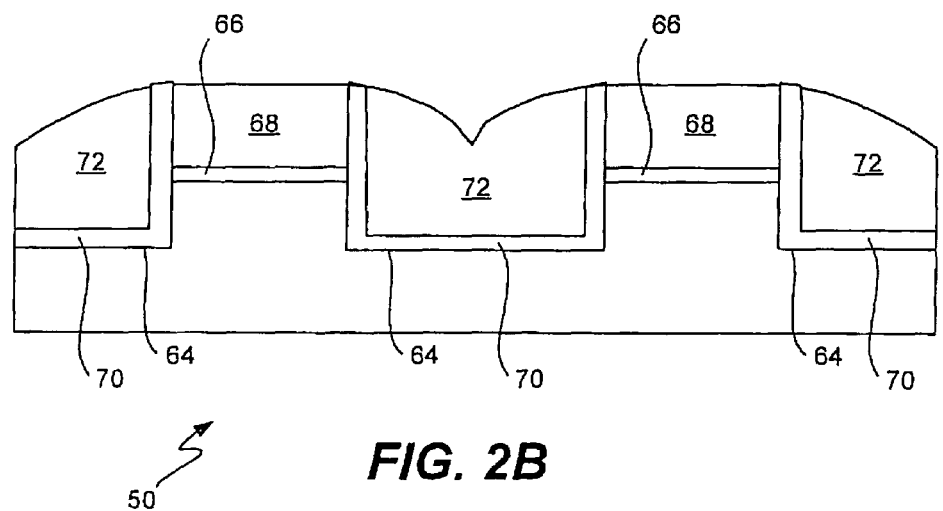
FIG. 2B shows a resultant cross sectional view subsequent to one or more operations in a process for forming a memory cell according to one embodiment of the present invention.

As shown in FIG. 2B, trenches 64 formed in one or more operations resulting in the cross section shown in FIG. 2A, are filled with sacrificial oxide. In one embodiment, a first oxide layer 70 is thermally grown. A second oxide layer 72 is next formed using CVD deposition. The purpose for forming sacrificial oxide layers 70 and 72 is to prevent ions generated in a subsequent implantation step from implanting into substrate 52 where source/drain regions 58 (discussed with reference to FIG. 1) are to be formed thereafter.

Figure 2C:
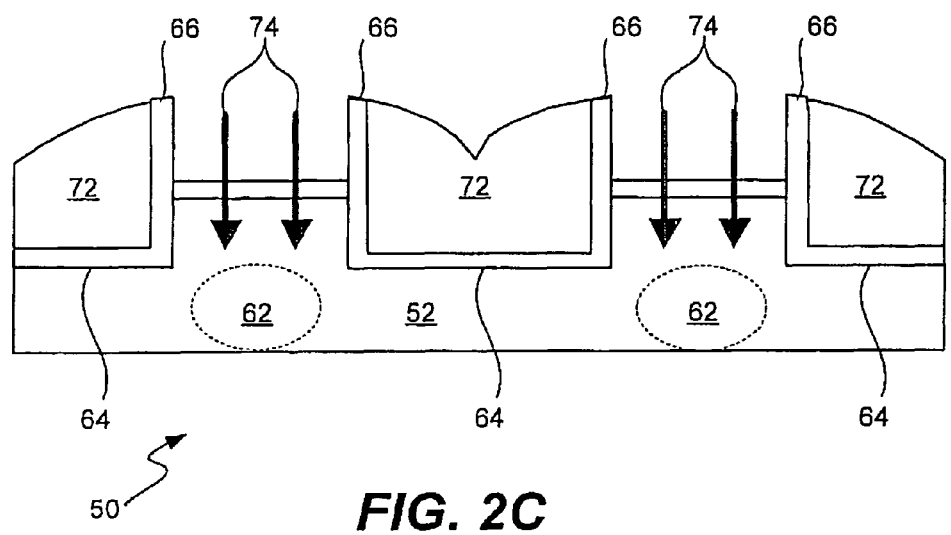
FIG. 2C shows a resultant cross sectional view subsequent to one or more operations in a process for forming a memory cell according to one embodiment of the present invention.

As shown FIG. 2C, subsequent to one or more operations that result in the cross section shown in FIG. 2B, bit line punch through barrier regions 62 are formed. As a part of the formation of bit line punch through barrier regions hard mask 68 is initially removed. Once hard mask 68 is removed, substrate 52 is subjected to an ion implantation step of anti-punch through dopant material, as is illustrated by arrows 74. In one embodiment, oxygen is implanted into the substrate followed by an annealing step of 450 to 1350 degrees C. to create buried oxide regions (e.g., bit line punch through barriers 62) and to cure implantation-induced damage at the same time.

In another embodiment, other temperatures can be employed in the annealing step. It should be appreciated that the implantation dose and energy should be controlled to locate the bit line punch through barrier between the bit lines and away from the channel surface. In an alternative embodiment, an anti-punch through dopant such as As, B, In, Sb, etc. can be implanted to form the barrier regions 62, but the diffusion of dopant material should be minimized during subsequent thermal cycles.

Figure 2D:
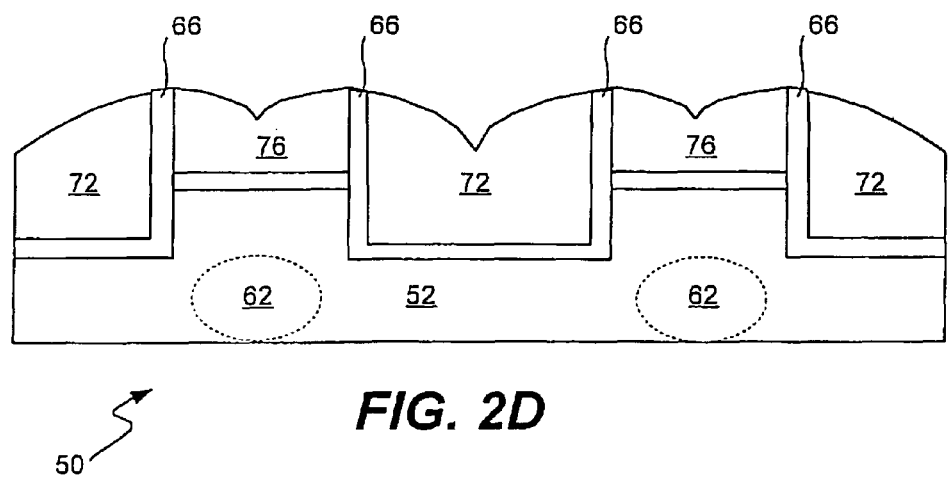
FIG. 2D shows a resultant cross sectional view subsequent to one or more operations in a process for forming a memory cell according to one embodiment of the present invention.

As shown in FIG. 2D, subsequent to the execution of one or more operations that result in the cross section shown in FIG. 2C, sacrificial nitride layer 76 is formed on substrate 52 over bit line punch through barrier regions 62 in substrate 52 and between trenched regions 64. The purpose of sacrificial layer 76 is to protect or prevent dopant materials that are subsequently employed to form source/drain regions 58 from being implanted in bit line punch through barrier regions 62 in substrate 52.

Figure 2E:
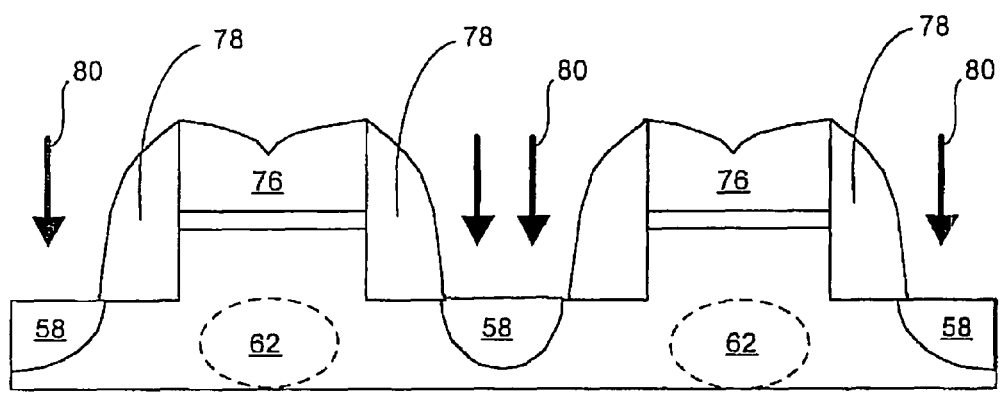
FIG. 2E shows a resultant cross sectional view subsequent to one or more operations in a process for forming a memory cell according to one embodiment of the present invention.

As shown in FIG. 2E, subsequent to the execution of one or more operations that result in the cross section shown in FIG. 2D, source/drain regions 58, discussed with reference to FIG. 1, are formed. This is accomplished by first removing the oxide layers 70 and 72 from trenches 64 using conventional semiconductor process techniques such as an oxide etch. Thereafter, spacer structures 78 are formed within the sidewalls of trenches 64. In various embodiments, the spacer structures can be formed from an oxide layer, nitride layer, or polymer material. With oxide for example the spacer structure can be either grown or deposited and then patterned using conventional semiconductor processing techniques. The width of the spacer is used to offset bit line diffusion. Once the spacer structures 78 are formed, an implantation step, as illustrated by arrows 80, is performed to create source/drain regions 58 in substrate 52. In various embodiments, an N type material such as Arsenic can be used. In alternate embodiments, P type materials such as Boron can be used.

Figure 2F:
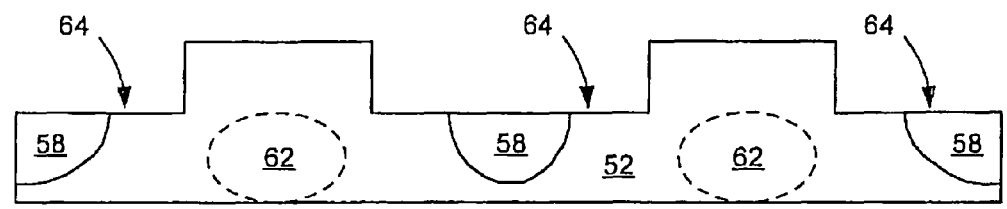
FIG. 2F shows a resultant cross sectional view subsequent to one or more operations in a process for forming a memory cell according to one embodiment of the present invention.

As shown in FIG. 2F, subsequent to the execution of one or more operations that result in the cross section shown in FIG. 2E, sacrificial nitride layer 76 and spacer structures 78 are removed from substrate 52. The resulting structure includes source/drain regions 58 and bit line punch through barrier regions 62 formed in substrate 52. Trenches 64 are also formed in the top surface of the substrate 52.

Figure 2G:
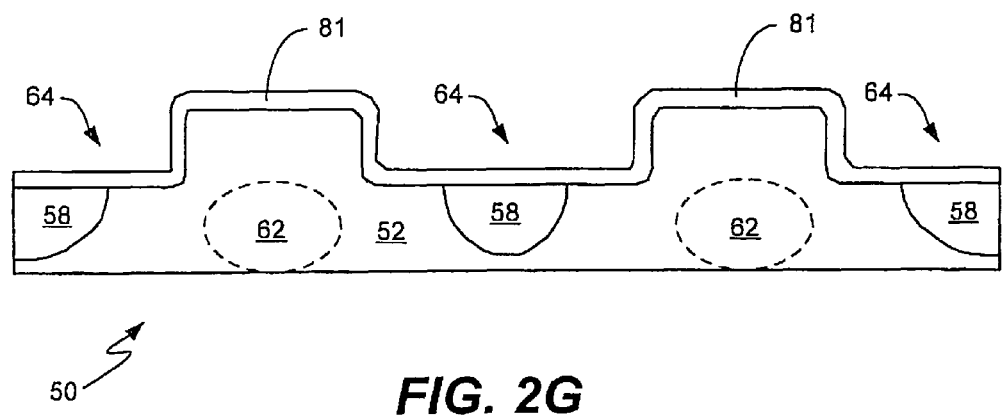
FIG. 2G shows a resultant cross sectional view subsequent to one or more operations in a process for forming a memory cell according to one embodiment of the present invention.
Figure 2H:
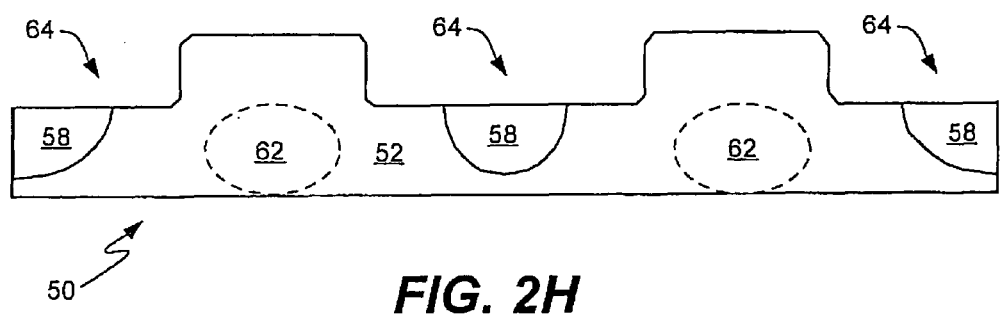
FIG. 2H shows a resultant cross sectional view subsequent to one or more operations in a process for forming a memory cell according to one embodiment of the present invention.

As illustrated in FIGS. 2G and 2H, subsequent to the execution of one or more operations that result in the cross section shown in FIG. 2F, a surface damage removal operation is performed. The surface damage removal operation is employed for the purpose of repairing the surface of substrate 52 after the above mentioned implantation operations have been executed. The surface damage removal step involves growing an annealing oxide layer 81 over the surface of substrate 52, as illustrated in FIG. 2G. In one embodiment, layer 81 is grown to a thickness of approximately 10-500 Angstroms. In another embodiment, either a thicker or a thinner layer can be grown. After layer 81 is grown and the surface repaired, layer 81 is removed, as is illustrated in FIG. 2H.

As is shown in FIGS. 2I, 2J, 2K and 2L, in operations subsequent to those discussed with reference to FIGS. 2G and 2H, storage elements 56 of memory cells 54 are formed. In one embodiment, storage elements 56 each include first oxide layer 82, charge trapping or storage layer 84, and second oxide layer 88 (see discussion made with reference to FIG. 2M below). In various embodiments, charge storage layer 84 can be nitride, polysilicon, or a silicon rich nitride. In other embodiments, other materials can be used to form charge storage layer 84.

Figure 2I:
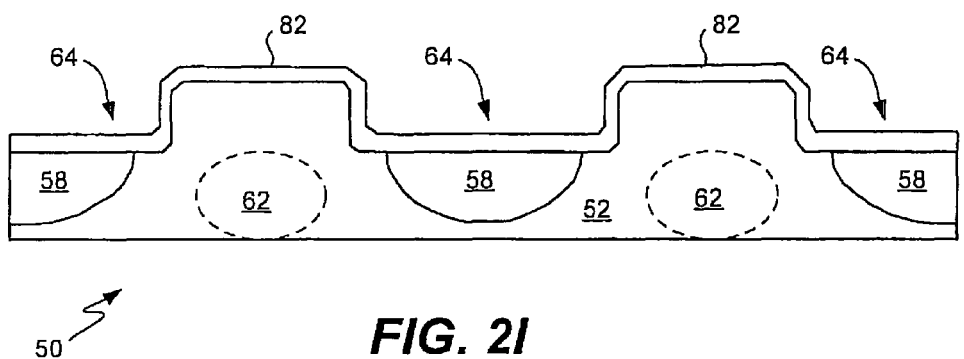
FIG. 2I shows a resultant cross sectional view subsequent to one or more operations in a process for forming a memory cell according to one embodiment of the present invention.

As shown in FIG. 2I, first oxide layer 82 results from a patterned oxide layer formed across the surface of the substrate 52. In various embodiments, first oxide layer 82 may be formed by either growing the oxide or by CVD deposition and then patterned using conventional semiconductor processing techniques. In one embodiment, oxide layer 82 is approximately 10-100 Angstroms thick. In other embodiments, other thicknesses can be employed and can be either thicker or thinner than 10-100 Angstroms.

Figure 2J:
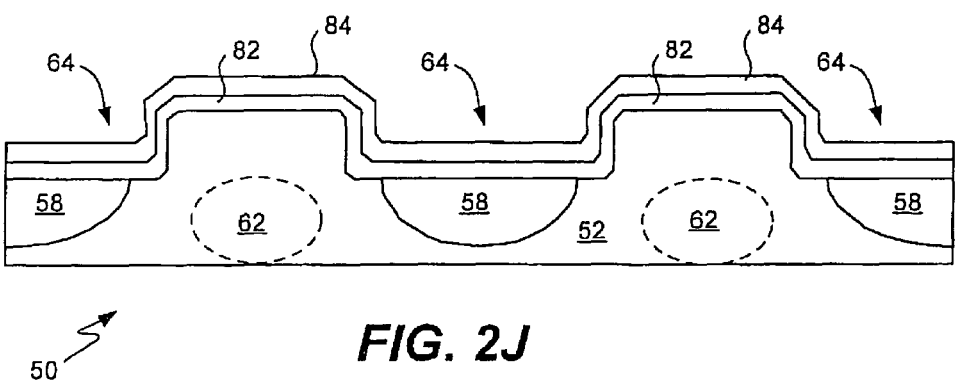
FIG. 2J shows a resultant cross sectional view subsequent to one or more operations in a process for forming a memory cell according to one embodiment of the present invention.

In FIG. 2J, charge storage layer 84 is deposited over first oxide layer 82 on substrate 52. In one embodiment, charge storage layer 84 is 40-150 Angstroms thick, and is formed using CVD processes. In other embodiments, other thicknesses can be employed, and can be either thicker or thinner than 40-150 Angstroms thick.

Figure 2K:
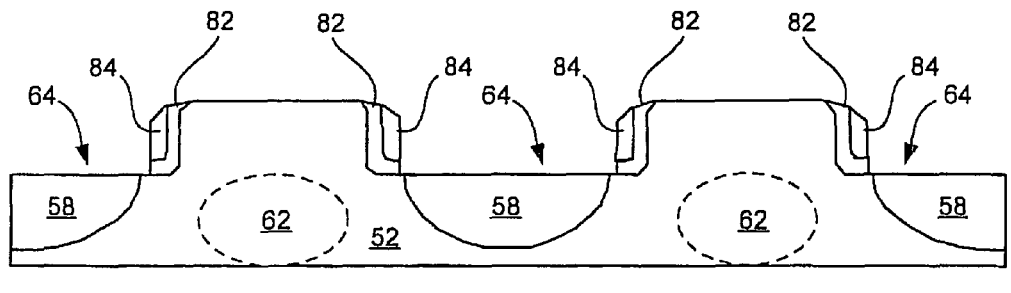
FIG. 2K shows a resultant cross sectional view subsequent to one or more operations in a process for forming a memory cell according to one embodiment of the present invention.

As shown in FIG. 2K, in operations subsequent to those resulting in the cross sections shown in FIG. 2I and FIG. 2J, first oxide layer 82 and charge storage layer 84 are etched back and patterned to form the two layers of storage elements 56 on the sidewalls of trenches 54. In other words, substantial portions of the two layers 82 and 84 are removed from the substrate surface, leaving the remaining portions of the two layers 82 and 84, as shown in FIG. 2K, intact on the sidewalls of trenches 54.

Figure 2L:
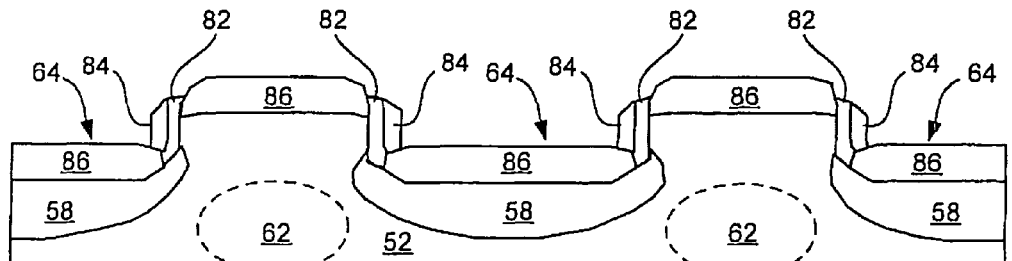
FIG. 2L shows a resultant cross sectional view subsequent to one or more operations in a process for forming a memory cell according to one embodiment of the present invention.

As shown in FIG. 2L, in operations subsequent to those resulting in the cross section shown in FIG. 2K, a thermal oxidation layer 86 is formed and patterned on the surface of substrate 52. Thermal oxidation layer 86 is self-patterned onto the regions above source/drain regions 58 and on the non-trenched surfaces of substrate 54 due to oxidation rate difference on silicon and charge trapping layer especially in ease of nitride and silicon rich nitride or other high k material used for layer 84. Layer 86 is employed to form a "birds beak" at the corner of the trench. In this way the vertical trench can be formed without the concern of the weak corner in FIG. 2A.

Figure 2M:
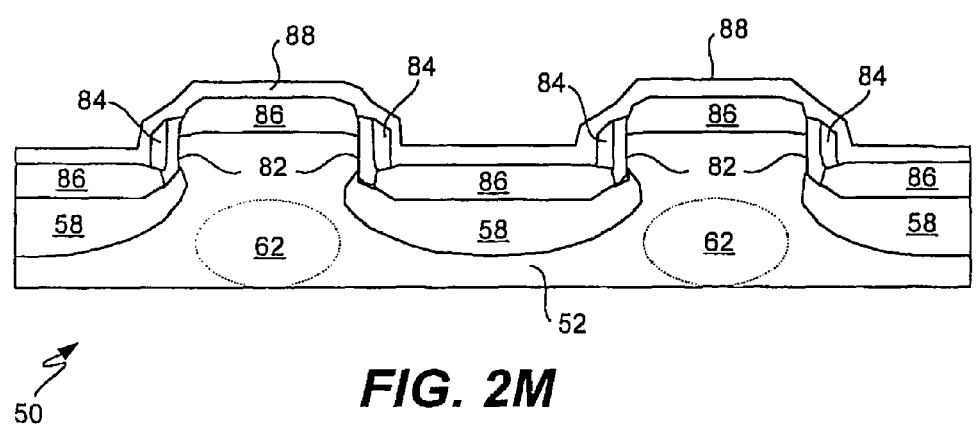
FIG. 2M shows a resultant cross sectional view subsequent to one or more operations in a process for forming a memory cell according to one embodiment of the present invention.

As shown in FIG. 2M, in operations subsequent to those resulting in the cross section shown in FIG. 2L, second oxide layer 88 of storage element 56 is formed. In one embodiment, second oxide layer 88 (40-250 Angstroms) is formed by CVD over the surface of substrate 52. As illustrated in FIG. 2M, second oxide layer 88 is formed on the side walls of trenches 64, forming the second oxide layer of storage elements 56.

In a final processing step, that results in the cross section shown in FIG. 1, word line 60 is formed for cells 54. In one embodiment, word line 60 is formed by depositing and patterning a layer of poly-silicon using standard semiconductor processing techniques.

In one embodiment, the thickness of first oxide layer 82, storage charge layer 84, and second oxide layer 88 of storage element 56 are 50, 70, and 50 Angstroms respectively. It should be noted that these dimensions are exemplary and in no way should be construed as limiting the invention. Actual dimensions in other embodiments may be thicker or thinner. As semiconductor process technology improves, it is expected that these dimensions will decrease further as the pitch of the memory cells is reduced.

Figure 3:
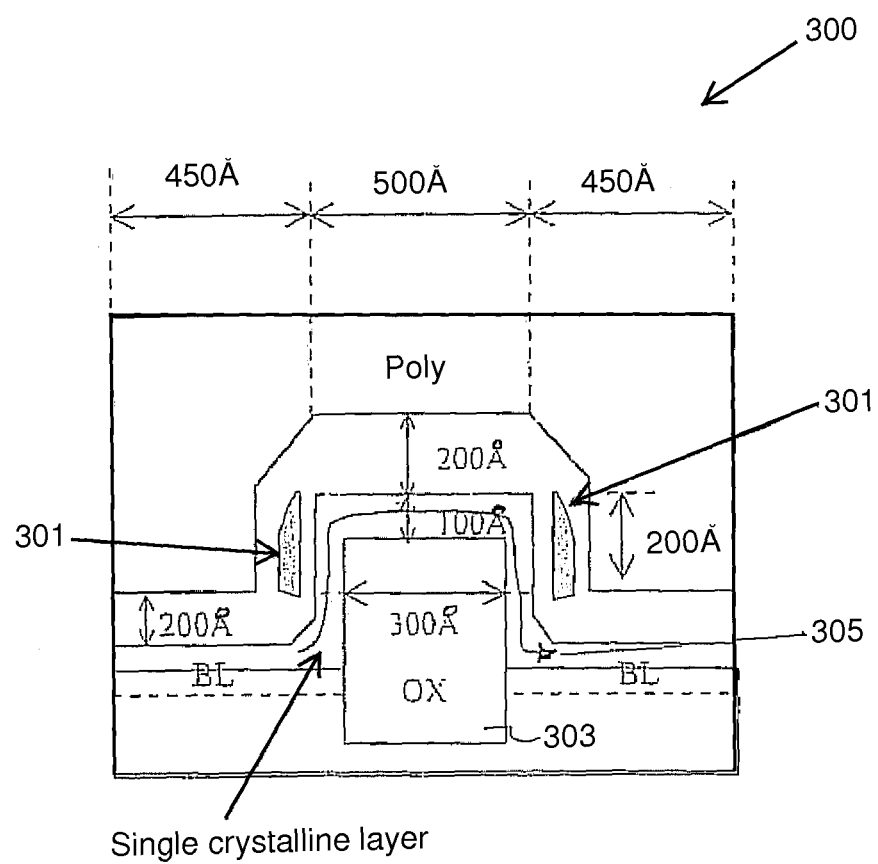
FIG. 3 shows features of a memory cell having a split charge storage node according to one embodiment of the present invention.

FIG. 3 shows features of a flash memory cell fabricated using the processes discussed with reference to FIGS. 2A-2M according to one embodiment of the present invention. Clearly depicted in FIG. 3 is the above discussed split node charge storage structure 301, the bit line punch through barrier 303 and the elongated channel structure 305 (see arrow that traces elongated channel structure). It should be appreciated that the advantages of these features are discussed in detail herein with reference to FIG. 1. Referring to FIG. 3, exemplary dimensions of structures whose formation is discussed in detail with reference to FIGS. 2A-2M are shown. It is important to note that the dimensions shown in FIG. 3 are only exemplary and other dimensions different from those shown in FIG. 3 can be employed.

Figure 4:
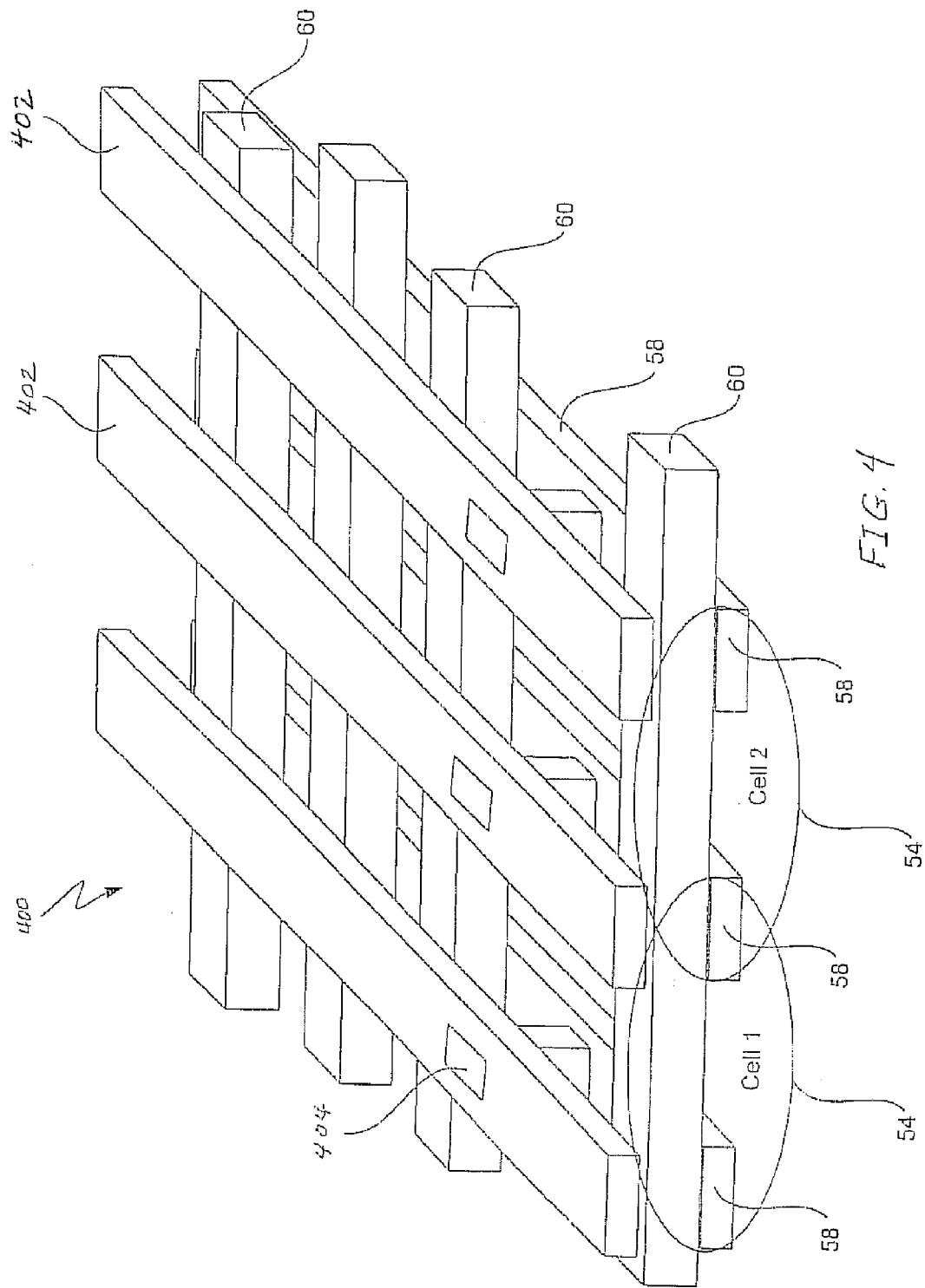
FIG. 4 is an array architecture using memory cells that have split charge storage nodes according to one embodiment of the present invention.

FIG. 4 shows an array architecture 400 that employs flash memory cells such as are described herein. Array 400 includes a plurality of the word lines 60 running in one direction and a plurality of overlying metal interconnects 402 running in the perpendicular direction. The metal interconnects 402 deliver a voltage to the underlying source/drain regions 58 through metal interconnects 404. FIG. 4 also shows two adjacent cells 54 labeled "cell 1" and "cell 2" in FIG. 4. The two cells 54 share a common source/drain region 58. The cells 54 of the present invention can be substituted in place of the aforementioned planar cell currently used in the MirrorBit technology mentioned above, and described in detail in U.S. Patents and Publications U.S. Pat. Nos. 6,861, 307, 6,917,068, 6,639,271, 6,215,702 and 2004/0021172, each of which are incorporated by reference herein for all purposes.

It should be noted that the programming and erasure of the memory cell 54 of one embodiment involves programming and erasure improvements as compared to conventional processes. In one embodiment, with storage elements 56 formed within trenches, the channel of each cell 54 is essentially shaped as an inverted "U" along the surface of the silicon substrate. It should be appreciated that this unique channel geometry can promote hot electron injection programming efficiency. Consequently, programming speed can be improved. Furthermore, because of the use of a silicon rich nitride or poly silicon in the formation of charge storage layer 88, charges can be removed more efficiently from charge storage element 56. The Fowler-Nordheim (EN) erase can therefore be more readily used, resulting in improved reliability.

Figure 5:
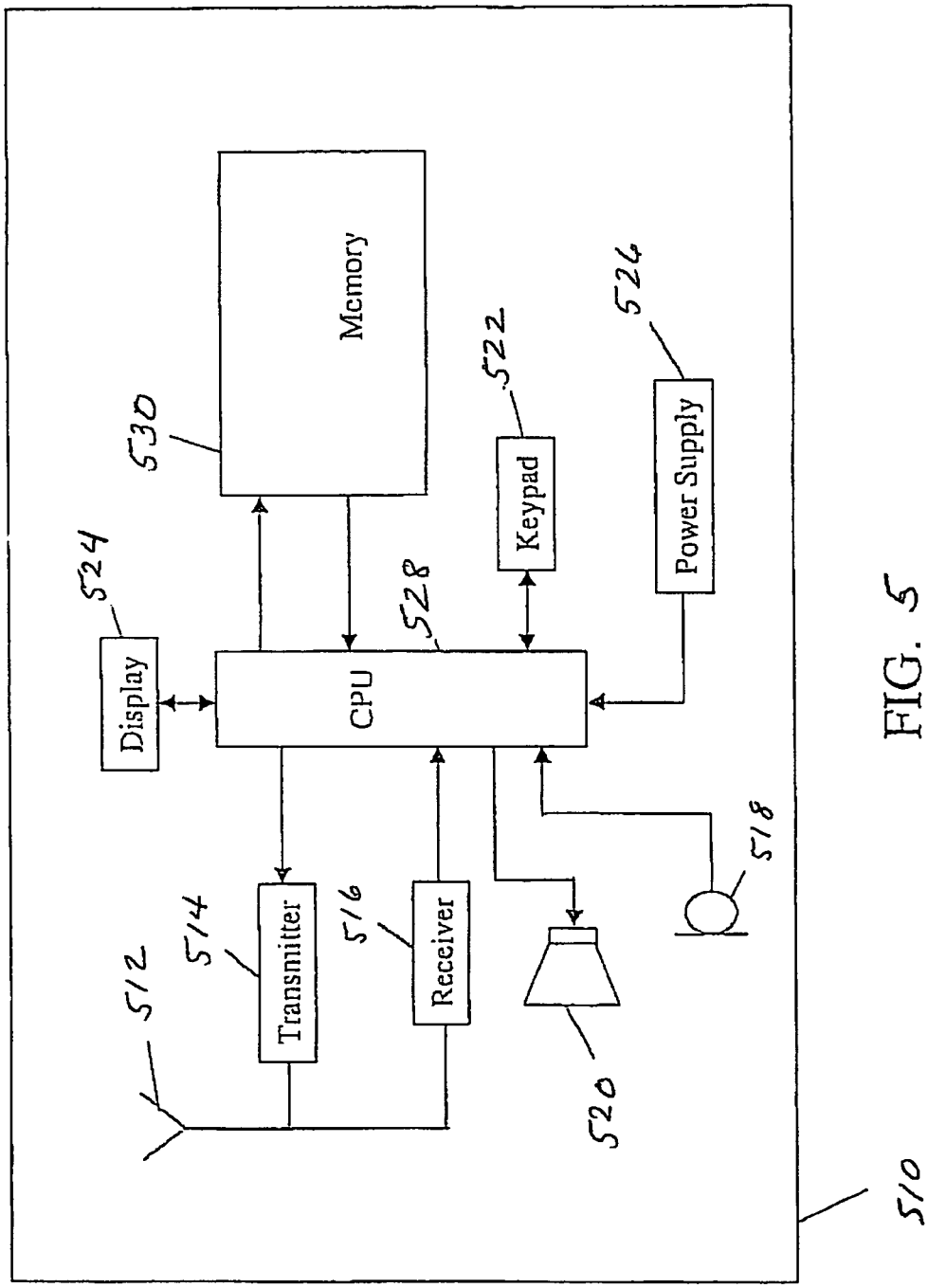
FIG. 5 shows a block diagram of a portable telephone (cell phone, cellular phone, mobile phone, internet protocol phone, wireless phone, etc.), that uses memory with memory cells that have split charge storage nodes according to one embodiment of the present invention.

Exemplary Operating Environments for Memory Cell Having Split Charge Storage Node According to One Embodiment FIG. 5 shows a block diagram of a portable telephone 510 (a.k.a. cell phone, cellular phone, mobile phone, internet protocol phone, wireless phone, etc.), that uses a memory device that includes memory cells that have split charge storage nodes according to one embodiment of the present invention. The cell phone 510 includes an antenna 512 coupled to a transmitter 514 a receiver 516, as well as, a microphone 518, speaker 520, keypad 522, and display 524. The cell phone 510 also includes a power supply 526 and a central processing unit (CPU) 528, which may be an embedded controller, conventional microprocessor, or the like. In addition, the cell phone 510 includes integrated, memory 530 with cells that have split charge storage nodes. In one embodiment, memory 530 with cells that have split charge storage nodes is structured as is shown in FIG. 1.

Figure 6:
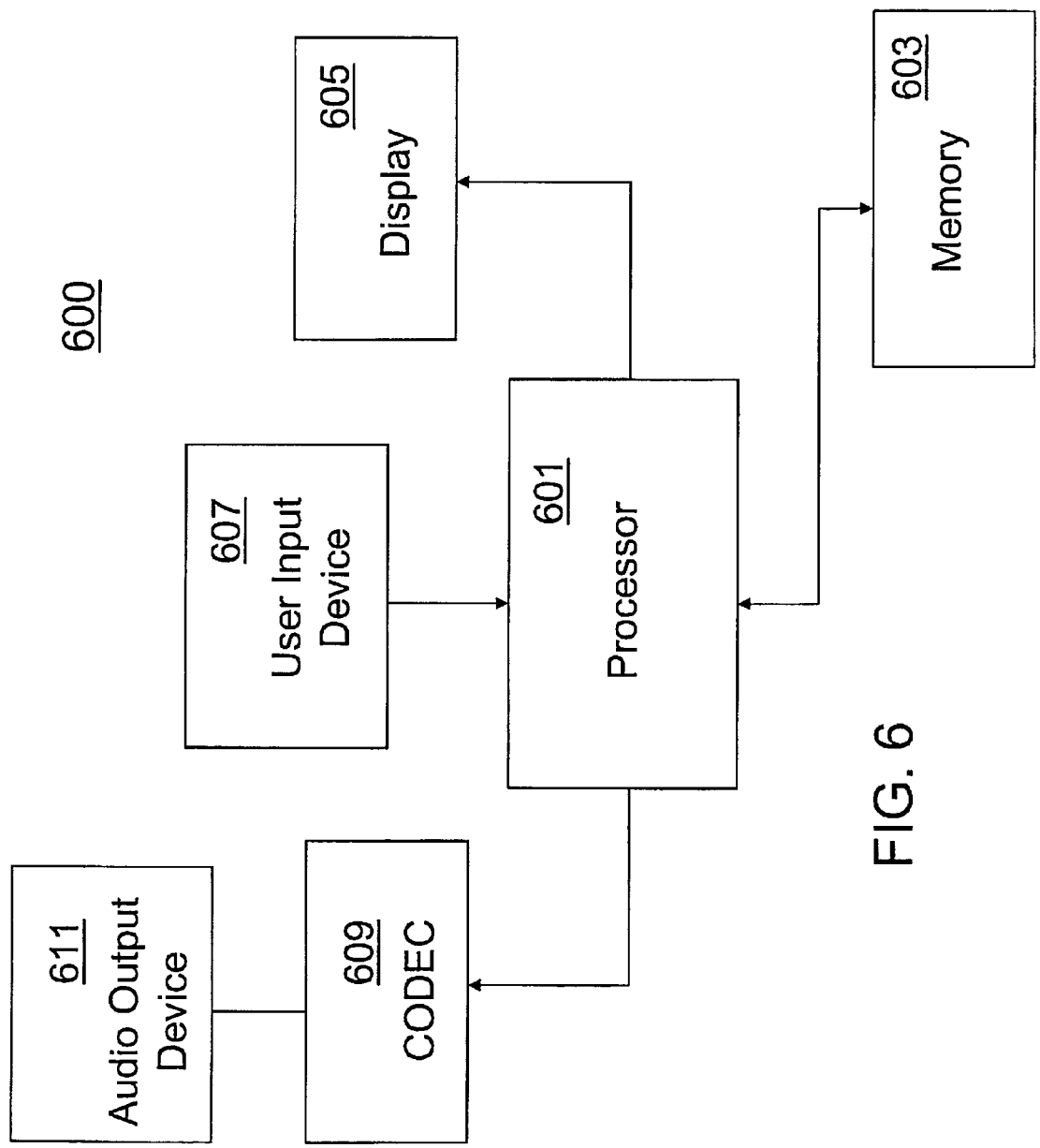
FIG. 6 shows a media player that uses memory with memory cells that have split charge storage nodes according to one embodiment of the present invention.

FIG. 6 shows a media player 600 that uses a memory device that includes memory cells that have split charge storage nodes according to one embodiment of the present invention. In the FIG. 6 embodiment, media player 600 includes processor 601, memory 603 that includes memory cells that have split charge storage nodes, display 605, user input 607, codec 609 and audio output 611.

In operation, processor 601 executes playback of media files and controls the operation of media player 600. In one embodiment, user inputs made via user input 607 can be used to trigger file playback, file record, stop file playback, playback volume control, etc. Memory 603 stores media files that may be stored for playback. In one embodiment, both audio and video files may be stored for playback. CODEC 609 produces an analog output signal that is supplied to audio output 611. In one embodiment, the playback of audio files can be facilitated via audio output 611 which can include but is not limited to speakers and headphones. In one embodiment, the playback of video files can be facilitated by a display 605 screen. In one embodiment, memory 603 is structured as is shown in FIG. 1.

Figure 7:
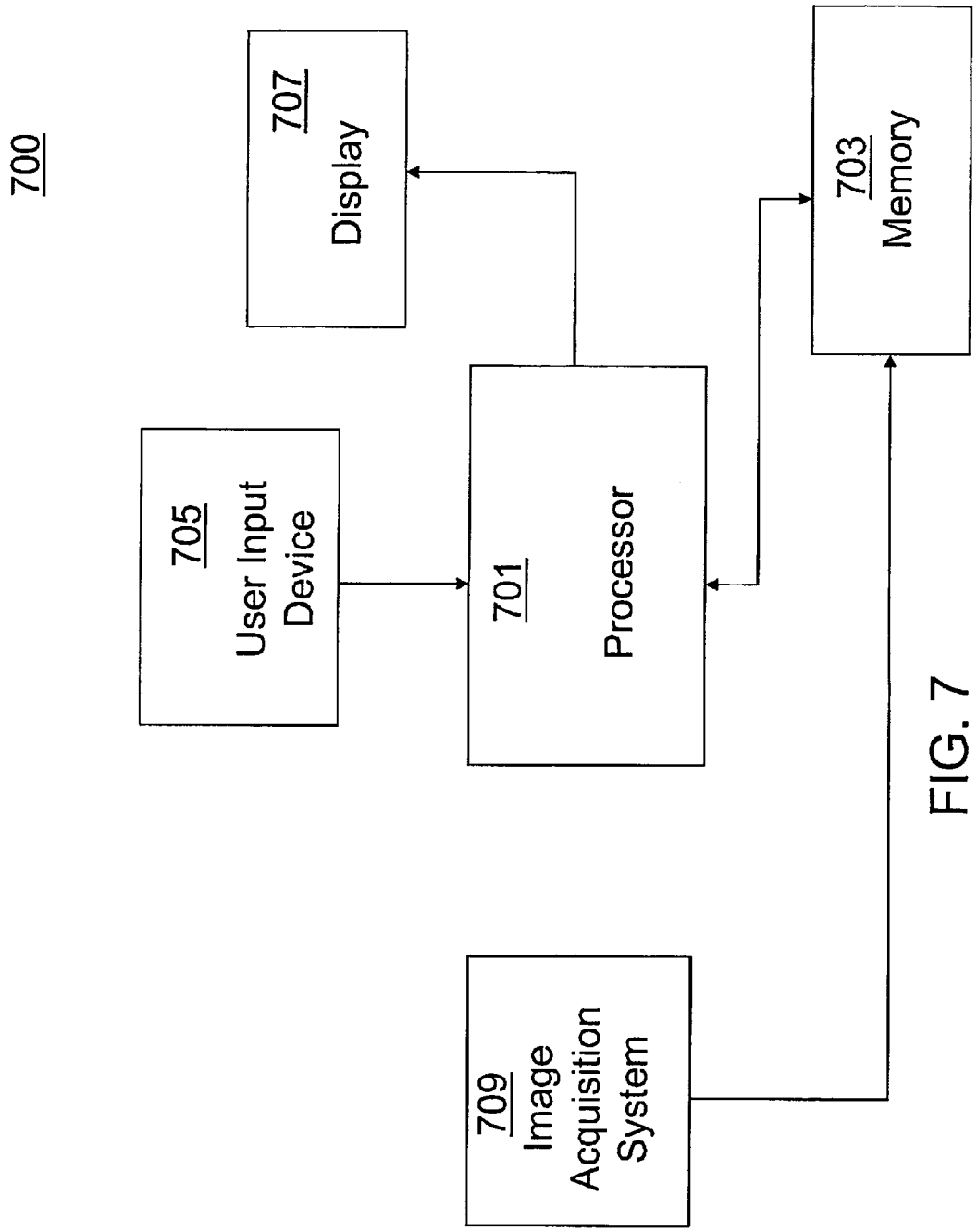
FIG. 7 shows a camera that uses memory with memory cells that have split charge storage nodes according to one embodiment of the present invention.

FIG. 7 shows a camera 700 that uses a non-volatile memory device as is described in detail herein according to one embodiment of the present invention. In the FIG. 7 embodiment, camera 700 includes processor 701, memory 703 with cells that have split charge storage nodes, user input 705, display screen 707 and image acquisition system 709. In operation, processor 701 controls the operation of camera 700 including the processing of image data acquired by image acquisition system 709. In one embodiment, user inputs made via user input 505 can be used to trigger image acquisition, storage, processing, display, etc. Memory 703 stores image files that may be stored for uploading or display purposes. In one embodiment, images may be presented on display screen 707.

In one embodiment, memory 703 is structured as is shown in FIG. 1 and FIG. 4. Also, as mentioned above, memory 703 can be used in a variety of other devices. For instance, memory can be utilized in personal digital assistants, set-top boxes, digital video recorders, networking and telecommunication equipments, printers, computer peripherals, automotive navigation devices, and gaming systems.

With reference to exemplary embodiments thereof, memory cells having split charge storage nodes and methods for fabricating memory cells having split charge storage nodes are disclosed. A disclosed method includes forming a first trench and an adjacent second trench in a semiconductor substrate, the first trench and the second trench each defining a first sidewall and a second sidewall respectively and forming a first source/drain region in the substrate and a second source/drain region in the substrate, where the first source/drain region and the second source/drain region are formed substantially under the first trench and the second trench in the semiconductor substrate respectively. Moreover, a method includes forming a bit line punch through barrier in the substrate between the first source/drain region and the second source drain region and forming a first storage element on the first sidewall of the first trench and a second storage element on the second sidewall of the second element. A word line is formed in contact with the first storage element and the second storage element.

Although many of the components and processes are described above in the singular for convenience, it will be appreciated by one of skill in the art that multiple components and repeated processes can also be used to practice the techniques of the present invention. Further, while the invention has been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of components and should not be restricted to the ones mentioned above. It is therefore intended that the invention be interpreted to include all variations and equivalents that fall within the true spirit and scope of the present invention.

We claim:

1. A method of fabricating a semiconductor memory cell having a split charge storage node, the method comprising:
   forming a first trench and an adjacent second trench in a semiconductor substrate, the first trench and the second trench each defining a first sidewall and a second sidewall respectively;
   forming a first source/drain region in the substrate and a second source/drain region in the substrate, the first source/drain region and the second source/drain region formed substantially under the first trench and the second trench in the semiconductor substrate respectively;
   forming a rectangular bit line punch through barrier in the substrate between the source and the drain of the first source/drain region and the second source/drain region,
   forming a discrete first oxide layer on each of the first and second sidewalls of the first and second trenches, the discrete first oxide layers of the first trench contacting a portion of the first source/drain region and the discrete first oxide layers of the second trench contacting a portion of the second source/drain region;
   forming a first storage element on the first sidewall of the first trench and a second storage element on the second sidewall of the second trench wherein a portion of the punch through barrier is formed above portions of the first and the second storage elements;
   forming a second oxide layer on the first and second sidewalls of the first and second trenches, the second oxide layer being formed contiguously over the first and second storage elements and the discrete first oxide layers of the first and second trenches; and
   forming a word line in contact with the first storage element and the second storage element.

2. The method of claim 1, wherein the first storage element is formed by:
   forming the first oxide layer on the first sidewall of the first trench;
   forming a charge storage layer on the first oxide layer; and
   forming the second oxide layer on the charge storage layer.

3. The method of claim 2, wherein the charge storage layer is a polysilicon or high K material comprising one of the following: nitride, $Si_3N_4$, or a silicon rich nitride.

4. A method of fabricating a memory array of memory cells having a split charge storage node, said method comprising:
   forming a semiconductor substrate from semiconductor material;
   forming a plurality of memory cells on said semiconductor substrate wherein the formation of each of the plurality of memory cells comprises:
   forming a first trench and an adjacent second trench in said semiconductor substrate, the first trench and the second trench each defining a first sidewall and a second sidewall respectively;
   forming a first source/drain region in the substrate and a second source/drain region in the substrate, the first source/drain region and the second source/drain region formed substantially under the first trench and the second trench in the semiconductor substrate respectively;
   forming a rectangular bit line punch through barrier in the substrate between the source and the drain of the first source/drain region and the second source/drain region,
   forming a discrete first oxide layer on each of the first and second sidewalls of the first and second trenches, the discrete first oxide layers of the first trench contacting a portion of the first source/drain region and the discrete first oxide layers of the second trench contacting a portion of the second source/drain region;

forming a first storage element on the first sidewall of the first trench and a second storage element on the second sidewall of the second trench wherein a portion of the punch through barrier is formed above portions of the first and the second storage elements;

forming a second oxide layer on the first and second sidewalls of the first and second trenches, the second oxide layer being formed contiguously over the first and second storage elements and the discrete first oxide layers of the first and second trenches;

forming a word line in contact with the first storage element and the second storage element; and forming a plurality of contacts for each of said plurality of memory cells that are formed on said semiconductor substrate.

5. The method of claim 4, wherein the first storage element is formed by:

forming the first oxide layer on the substrate;

forming a charge storage layer on the first oxide layer, wherein the first oxide layer and the charge storage layer are etched through an etch process to form two layers of the first storage element on the first sidewall of the first trench; and forming the second oxide layer on the charge storage layer.

6. The method of claim 5, wherein the charge storage layer is a polysilicon or high K material comprising one of the following: nitride, $Si_3N_4$, or a silicon rich nitride.

7. The method of claim 5, wherein the etch process is configured to leave intact the first layer and the charge storage layer on the first sidewall and the first trench.

* * * * *